(12) United States Patent
Niboshi et al.

(10) Patent No.: US 9,755,177 B2
(45) Date of Patent: Sep. 5, 2017

(54) ORGANIC ELECTROLUMINESCENT DISPLAY PANEL

(71) Applicant: Sharp Kabushiki Kaisha, Osaka-shi, Osaka (JP)

(72) Inventors: Manabu Niboshi, Osaka (JP); Yoshiyuki Isomura, Osaka (JP); Yuto Tsukamoto, Osaka (JP); Katsuhiro Kikuchi, Osaka (JP); Hideki Uchida, Osaka (JP); Ayataka Endo, Osaka (JP); Asae Ito, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/025,931

(22) PCT Filed: Oct. 8, 2014

(86) PCT No.: PCT/JP2014/076969
§ 371 (c)(1),
(2) Date: Mar. 30, 2016

(87) PCT Pub. No.: WO2015/053325
PCT Pub. Date: Apr. 16, 2015

(65) Prior Publication Data
US 2016/0218311 A1  Jul. 28, 2016

(30) Foreign Application Priority Data
Oct. 9, 2013  (JP) .................................. 2013-212111

(51) Int. Cl.
*H01L 51/50* (2006.01)
*H01L 51/52* (2006.01)
(Continued)

(52) U.S. Cl.
CPC ...... *H01L 51/5068* (2013.01); *H01L 27/3262* (2013.01); *H01L 29/7869* (2013.01);
(Continued)

(58) Field of Classification Search
CPC ............. H01L 51/5068; H01L 27/3262; H01L 29/7869; H01L 51/50; H01L 51/5084; H01L 51/5092; H01L 51/5278
See application file for complete search history.

(56) References Cited

U.S. PATENT DOCUMENTS

| 2003/0038594 A1 | 2/2003 | Seo et al. |
| 2005/0212416 A1 | 9/2005 | Seo et al. |

(Continued)

FOREIGN PATENT DOCUMENTS

| JP | 2003-178882 A | 6/2003 |
| JP | 3748110 B1 | 2/2006 |

(Continued)

*Primary Examiner* — Karen Kusumakar
(74) *Attorney, Agent, or Firm* — Keating & Bennett, LLP

(57) ABSTRACT

The organic EL display panel includes: an active matrix substrate including a thin-film transistor; and an organic EL element disposed on the active matrix substrate, the organic EL element including, in the order from the active matrix substrate side, a cathode electrically connected to the thin-film transistor, a first charge conversion layer in contact with the cathode, a first hole injection layer, a first hole transport layer, a first light-emitting layer, a first electron transport layer, a first electron injection layer, a second charge conversion layer, and an anode in contact with the second charge conversion layer, the first charge conversion layer designed to inject electrons into the cathode and emit holes to the first light-emitting layer side, the second charge conversion layer designed to inject holes into the anode and emit electrons to the first light-emitting layer side.

12 Claims, 9 Drawing Sheets

(51) Int. Cl.
*H01L 27/32* (2006.01)
*H01L 29/786* (2006.01)
(52) U.S. Cl.
CPC .......... *H01L 51/50* (2013.01); *H01L 51/5084* (2013.01); *H01L 51/5092* (2013.01); *H01L 51/5278* (2013.01); *H01L 27/3209* (2013.01); *H01L 27/3248* (2013.01); *H01L 51/5088* (2013.01); *H01L 2251/301* (2013.01); *H01L 2251/303* (2013.01); *H01L 2251/5307* (2013.01); *H01L 2251/5315* (2013.01); *H01L 2251/5353* (2013.01)

(56)  References Cited

U.S. PATENT DOCUMENTS

| | | | |
|---|---|---|---|
| 2006/0038484 A1* | 2/2006 | Noh | C07D 487/16 313/499 |
| 2007/0046196 A1 | 3/2007 | Seo et al. | |
| 2007/0182320 A1 | 8/2007 | Nakamura | |
| 2007/0200125 A1 | 8/2007 | Ikeda et al. | |
| 2008/0074047 A1* | 3/2008 | Lee | H01L 51/5278 313/506 |
| 2009/0096352 A1 | 4/2009 | Spindler et al. | |
| 2010/0096627 A1 | 4/2010 | Ikeda et al. | |
| 2010/0141131 A1 | 6/2010 | Seo et al. | |
| 2010/0207518 A1 | 8/2010 | Ikeda et al. | |
| 2011/0115369 A1 | 5/2011 | Seo et al. | |

FOREIGN PATENT DOCUMENTS

| | | |
|---|---|---|
| JP | 2007-214228 A | 8/2007 |
| JP | 2011-501432 A | 1/2011 |

\* cited by examiner

ORGANIC ELECTROLUMINESCENT DISPLAY PANEL

TECHNICAL FIELD

The present invention relates to an organic electroluminescent display panel (hereinafter, also referred to as an "organic EL display panel"). More specifically, the present invention relates to an inverted organic EL display panel.

BACKGROUND ART

Organic electroluminescent elements (hereinafter, also referred to as "organic EL elements") utilizing electroluminescence of organic materials have drawn attention as display elements used for thin display devices. Organic EL elements emit light when holes injected from the anode and electrons injected from the cathode recombine within a light-emitting layer disposed between these electrodes. Such organic EL elements spontaneously emitting light have advantages such as high-luminance light emission, a high response speed, a wide viewing angle, a thin profile, and a light weight, and are therefore expected to be applied to various fields such as display panels and illumination lamps.

Organic EL display panels including an organic EL element are usually designed such that the bottom electrode disposed on the substrate is an anode and the top electrode is a cathode. In order to give higher functionality to organic EL display panels having such a structure, an inverted structure in which the bottom electrode is a cathode and the top electrode is an anode have been studied. The following shows the examples thereof.

Patent Literature 1 discloses an organic EL element including, between a light-emitting unit disposed on a bottom electrode and a top electrode, a connection layer that supplies a charge to the light-emitting unit, and a charge transport layer that has charge transporting properties of a reverse conducting type against a charge to be injected from the top electrode, in the order from the light-emitting unit side.

Patent Literature 2 discloses an organic electroluminescent display device having the inverted structure as described above in which an electron-accepting layer having specific properties is disposed between a hole-transporting layer and an anode and an electron-accepting layer having specific properties is disposed between an electron-transporting layer and a cathode.

Patent Literature 3 discloses a light-emitting device including a conductive film made of an inorganic compound with specific properties, between a cathode and an organic compound layer in contact with an anode.

Patent Literature 4 discloses a light-emitting device including a mixture layer containing molybdenum oxide and an aromatic amine compound, disposed in contact with the bottom electrode.

CITATION LIST

Patent Literature

Patent Literature 1: JP 2007-214228 A
Patent Literature 2: JP 2011-501432 T
Patent Literature 3: JP 2003-178882 A
Patent Literature 4: JP 3748110 B

SUMMARY OF INVENTION

Technical Problem

In some organic EL display panels, organic EL elements are driven by thin-film transistors. For such organic EL display panels, an inverted structure (hereinafter, such an organic EL display panel is also referred to as a "conventional inverted organic EL display panel") is preferred to the above-described ordinary structure (hereinafter, such an organic EL display panel is also referred to as a "conventional ordinary organic EL display panel"). The reasons therefor are described below.

First, a conventional ordinary organic EL display panel is described with reference to FIG. 9 and FIG. 10. FIG. 9 is a schematic cross-sectional view illustrating a conventional ordinary organic EL display panel. As illustrated in FIG. 9, an organic EL display panel 101a includes an active matrix substrate 2 and an organic EL element 103a disposed on the active matrix substrate 2. The organic EL element 103a includes an anode 5, a hole injection layer 6a, a hole transport layer 7a, a light-emitting layer 8a, an electron transport layer 9a, an electron injection layer 10a, and a cathode 4 in the order from the active matrix substrate 2 side. In this case, the electron injection layer 10a is an ultrathin film of lithium fluoride (LiF) having a thickness of about 0.5 nm, for example, and the cathode 4 is made of a metal having a low work function, such as aluminum (Al), for example, so that the electron injection function is provided.

FIG. 10 is an equivalent circuit diagram of the vicinity of an interface between the anode and the active matrix substrate in FIG. 9. FIG. 10 illustrates the positions of the organic EL element 103a and a thin-film transistor 13 relative to power supply voltages 14a, 14b, and 14c. The anode 5 of the organic EL element 103a is electrically connected to a source electrode 16, and is connected to each pixel via a drain electrode 17. The cathode 4 is at a common potential.

FIG. 11 is a graph showing the drive voltage of an organic EL element. FIG. 11 shows the drive voltage in the case of driving a blue light-emitting element with a luminance of 5000 cd/m². As shown in FIG. 11, continuous driving for 150 hours increased the drive voltage of the organic EL element by about 0.3 V. In a configuration as illustrated in FIG. 10, this increase in the drive voltage of the organic EL element 103a is accompanied by a decrease in the voltage between the gate electrode 15 and the source electrode 16 by about 0.3 V. As a result, the current flowing in the organic EL element 103a decreases, thereby decreasing the luminance.

Next, a conventional inverted organic EL display panel is described with reference to FIG. 12 and FIG. 13. FIG. 12 is a schematic cross-sectional view illustrating a conventional inverted organic EL display panel. As illustrated in FIG. 12, an organic EL display panel 101b includes the active matrix substrate 2, and an organic EL element 103b disposed on the active matrix substrate 2. The organic EL element 103b includes the cathode 4, the electron injection layer 10a, the electron transport layer 9a, the light-emitting layer 8a, the hole transport layer 7a, the hole injection layer 6a, and the anode 5 in the order from the active matrix substrate 2 side.

FIG. 13 is an equivalent circuit diagram of the vicinity of an interface between the cathode and the active matrix substrate in FIG. 12. FIG. 13 illustrates the positions of the organic EL element 103b and the thin-film transistor 13 relative to the power supply voltages 14a, 14b, and 14c. The cathode 4 of the organic EL element 103b is electrically connected to the drain electrode 17. The anode 5 is at a common potential.

In a configuration as illustrated in FIG. 13, an increase in the drive voltage of the organic EL element as shown in FIG. 11 does not affect the voltage between the gate electrode 15 and the source electrode 16. As a result, the organic EL element 103b can be driven by constant current, and thus the luminance is maintained.

As described above, in the case of driving an organic EL element with a thin-film transistor, an organic EL display panel having an inverted structure is advantageous in terms of maintaining the luminance.

However, the electron injection performance of the conventional inverted organic EL display panel 101b as illustrated in FIG. 12 may be degraded compared to that of the conventional ordinary organic EL display panel 101a as illustrated in FIG. 9.

This is because, whereas the electron injection layer 10a is formed on the electron transport layer 9a in the conventional ordinary organic EL display panel 101a as illustrated in FIG. 9, the electron transport layer 9a is formed on the electron injection layer 10a in the conventional inverted organic EL display panel 101b as illustrated in FIG. 12. These different configurations produce different energy barriers between the electron transport layer 9a and the electron injection layer 10a. The reasons therefor are described below.

In the configuration as illustrated in FIG. 9, the electron injection layer 10a (e.g. ultrathin film of LiF) is formed on the electron transport layer 9a (by, for example, vacuum deposition or sputtering), for example. In formation of the electron injection layer 10a, if the electron transport layer 9a is made of a low-density organic compound, the deposition particles (e.g. LiF or Li ions) constituting the electron injection layer 10a having thermal energy collide with the electron transport layer 9a. At this time, some of the deposition particles are considered to enter the inside of the electron transport layer 9a from the outermost surface to some depth. This phenomenon presumably induces the energy band bending of the electron transport layer 9a to reduce the energy barrier between the electron transport layer 9a and the electron injection layer 10a.

In contrast, in the configuration as illustrated in FIG. 12, even when the electron injection layer 10a is formed on the cathode 4 and then the electron transport layer 9a is formed on the electron injection layer 10a, the deposition particle entry as described above does not occur. Hence, the energy band bending of the electron transport layer 9a does not occur.

The energy barrier between the electron transport layer 9a and the electron injection layer 10a in the configuration as illustrated in FIG. 12 is therefore higher than that in the configuration as illustrated in FIG. 9. For this reason, use of the conventional inverted organic EL element 101b may degrade the electron injection performance.

In order to analyze the phenomenon described above, the current-voltage properties of a conventional ordinary organic EL display panel and a conventional inverted organic EL display panel were compared. The results of the analysis are described below.

FIG. 14 is a schematic cross-sectional view illustrating a conventional ordinary organic EL display panel for analysis. As illustrated in FIG. 14, an organic EL display panel 101c includes a glass substrate 18 and an organic EL element 103c disposed on the glass substrate 18. The organic EL element 103c includes an anode 5a, a hole-blocking layer 19, the electron transport layer 9a, the electron injection layer 10a, and a cathode 4a in the order from the glass substrate 18 side.

FIG. 15 is a schematic cross-sectional view illustrating a conventional inverted organic EL display panel for analysis. As illustrated in FIG. 15, an organic EL display panel 101d includes the glass substrate 18 and an organic EL element 103d disposed on the glass substrate 18. The organic EL element 103d includes the cathode 4a, the electron injection layer 10a, the electron transport layer 9a, the hole-blocking layer 19, and the anode 5a in the order from the glass substrate 18 side.

Analysis results of the current-voltage properties of the organic EL display panels 101c and 101d are as shown in FIG. 16. FIG. 16 is a graph showing the current-voltage properties of the conventional ordinary organic EL display panel and the conventional inverted organic EL display panel. Here, the cathode 4a was made of Al, and the anode 5a was made of indium tin oxide (ITO). The electron injection layer 10a was made of LiF, and had a thickness of 0.5 nm. The electron transport layer 9a was made of bathophenanthroline (Bphen), and had a thickness of 50 nm. The hole-blocking layer 19 was made of bathocuproine (BCP), and had a thickness of 10 nm. As shown in FIG. 16, the current density in the conventional inverted organic EL display panel 101d was half of or less than that of the conventional ordinary organic EL display panel 101c, which shows that the current did not easily flow.

As described above, the configurations (e.g., organic EL display panels 101b and 101d) with the electron transport layer disposed on the electron injection layer degrade the electron injection performance compared to the configurations (e.g., organic EL display panels 101a and 101c) with the electron injection layer disposed on the electron transport layer.

Moreover, in the case that inverted organic EL display panels include an easily handleable conventionally used material such as LiF and an alloy of Al and Li (hereinafter, also referred to as "Al—Li") or a layer obtained by laminating Al on LiF (hereinafter, also referred to as "LiF/Al"), prevention of degradation of electron injection performance has not yet been achieved. Hence, production of inverted organic EL display panels can still be facilitated.

Patent Literature 1 states that it provides an organic EL element capable of improving the initial drive voltage and luminance properties and the life properties in a top emission structure provided with a light-transmissive top electrode. However, in the case of designing the invention of Patent Literature 1 to have an inverted structure, the electron injection layer comes on the cathode. The invention therefore can still be improved in terms of sufficiently preventing degradation of the electron injection performance.

Patent Literature 2 states that it provides an inverted organic electroluminescent display device which shows a reduced rise in drive voltage with time. Also, Patent Literature 2 discloses use of the electron-transporting layer containing elemental Li. Li, however, is not an easily handleable material because it reacts vigorously with moisture, and may be heated even by moisture in the air. The production of the invention disclosed in Patent Literature 2 therefore can still be facilitated.

Patent Literature 3 states that it improves the electron injection performance from the cathode to the light-emitting element and provides a means to solve problems in the production process. Patent Literature 3 also discloses a conductive film that is formed by depositing a material such as calcium nitride or calcium sulfide. However, these materials have high deposition temperatures and are easily oxidized without using nitrogen gas or sulfur gas during deposition. Hence, these materials are less likely to achieve sufficient performance and are difficult to handle. The production of the invention disclosed in Patent Literature 3 therefore can still be facilitated.

Patent Literature 4 states that it provides a light-emitting element having a low drive voltage whose life can be further lengthened compared to conventional light-emitting elements. However, in the case of designing the invention of Patent Literature 4 to have an inverted structure, the electron injection layer comes on the cathode. The invention therefore can still be improved in terms of sufficiently preventing degradation of the electron injection performance.

The present invention was made in view of the above state of the art, and aims to provide an organic EL display panel that has an inverted structure, can sufficiently prevent degradation of the electron injection performance, and can provide increased ease of production.

Solution to Problem

The present inventors have made various studies on organic EL display panels that have an inverted structure, can sufficiently prevent degradation of the electron injection performance, and can provide increased ease of production. As a result, the inventors have focused on disposing the anode and the cathode at the opposite positions with respect to the conventional ordinary organic EL display panels, and providing a charge conversion layer on the surface of each of these electrodes on the side facing the other electrode. The inventors have then found that an organic EL display panel having a new inverted structure can be obtained by designing a charge conversion layer in contact with the cathode to inject electrons into the cathode and emit holes to the light-emitting layer side while designing a charge conversion layer in contact with the anode to inject holes into the anode and emit electrons to the light-emitting layer side. Also, the inventors have found that since the electron injection layer is disposed on the electron transport layer in the same manner as in the conventional ordinary organic EL display panels, degradation of electron injection performance can be sufficiently prevented. Furthermore, the inventors have found that since the organic EL display panel of the present invention has the same structure as the conventional ordinary organic EL display panel except that the anode and the cathode are disposed at the opposite positions and the charge conversion layers are provided, the organic EL display panel of the present invention can be made of conventionally used easily handleable materials, with increased ease of production. As a result, the inventors have solved the above problems, and have thereby made the present invention.

That is, one embodiment of the present invention may be an organic electroluminescent display panel including: an active matrix substrate including a thin-film transistor; and an organic electroluminescent element disposed on the active matrix substrate, the organic electroluminescent element including, in the order from the active matrix substrate side, a cathode electrically connected to the thin-film transistor, a first charge conversion layer in contact with the cathode, a first hole injection layer, a first hole transport layer, a first light-emitting layer, a first electron transport layer, a first electron injection layer, a second charge conversion layer, and an anode in contact with the second charge conversion layer, the first charge conversion layer designed to inject electrons into the cathode and emit holes to the first light-emitting layer side, the second charge conversion layer designed to inject holes into the anode and emit electrons to the first light-emitting layer side.

Advantageous Effects of Invention

The present invention can provide an organic EL display panel that has an inverted structure, can sufficiently prevent degradation of the electron injection performance, and can provide increased ease of production.

DESCRIPTION OF EMBODIMENTS

Hereinafter, the present invention will be described in more detail based on embodiments (examples) with reference to drawings. The present invention is not limited to these embodiments (examples). The configurations of the respective embodiments (examples) may be combined or modified within the spirit of the present invention.

[Embodiment 1]

Embodiment 1 relates to a configuration in which a conventional ordinary organic EL display panel is inverted to put the cathode and the anode at the opposite positions, and a charge conversion layer is disposed on the surface of each of these electrodes on the side facing the other electrode.

Figure 1:
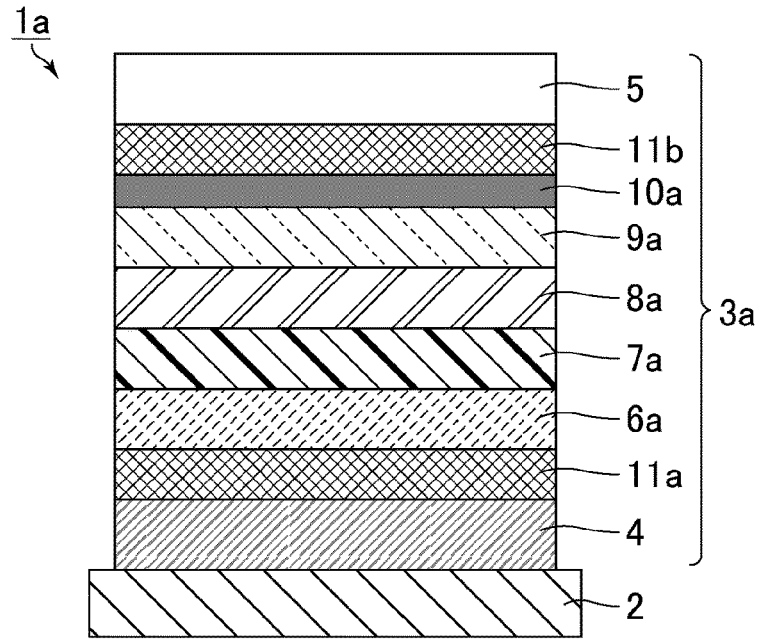
FIG. 1 is a schematic cross-sectional view illustrating an organic EL display panel of Embodiment 1.

FIG. 1 is a schematic cross-sectional view illustrating an organic EL display panel of Embodiment 1. As illustrated in FIG. 1, an organic EL display panel 1a includes the active matrix substrate 2 and an organic EL element 3a disposed on the active matrix substrate 2. The organic EL element 3a includes, in the order from the active matrix substrate 2 side, the cathode 4, a charge conversion layer 11a (first charge conversion layer), the hole injection layer 6a (first hole injection layer), the hole transport layer 7a (first hole transport layer), the light-emitting layer 8a (first light-emitting layer), the electron transport layer 9a (first electron transport layer), the electron injection layer 10a (first electron injection layer), a charge conversion layer 11b (second charge conversion layer), and the anode 5.

Figure 13:
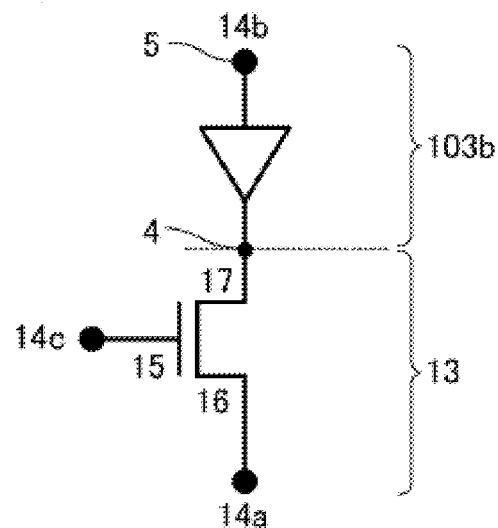
FIG. 13 is an equivalent circuit diagram of the vicinity of an interface between the cathode and the active matrix substrate in FIG. 12.
Figure 14:
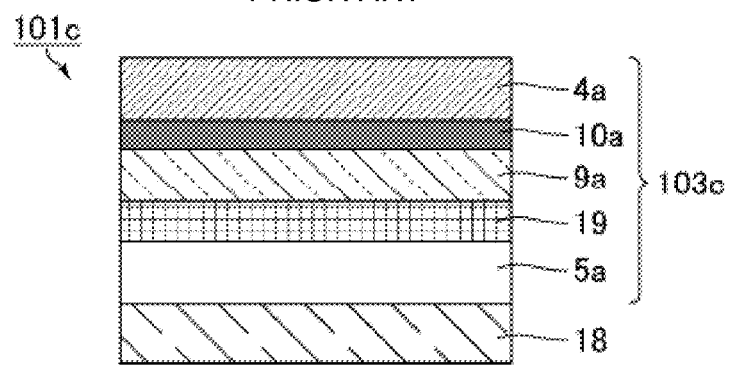
FIG. 14 is a schematic cross-sectional view illustrating a conventional ordinary organic EL display panel for analysis.
Figure 15:
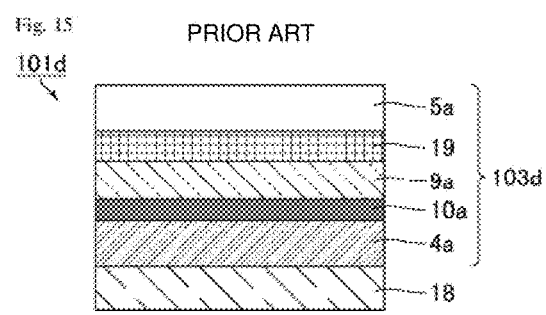
FIG. 15 is a schematic cross-sectional view illustrating a conventional inverted organic EL display panel for analysis.
Figure 16:
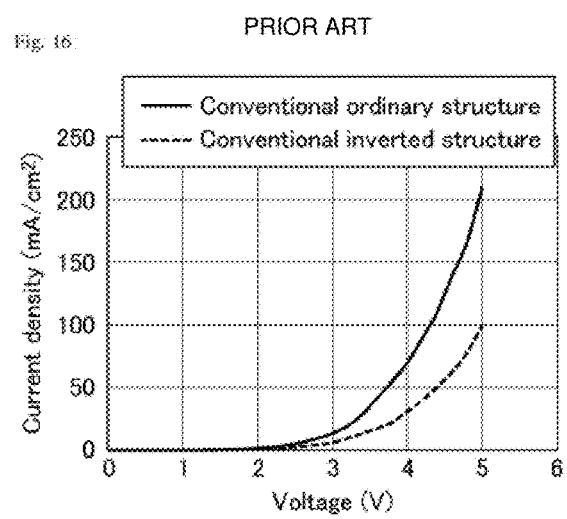
FIG. 16 is a graph showing the current-voltage properties of the conventional ordinary organic EL display panel and the conventional inverted organic EL display panel.

The active matrix substrate 2 includes thin-film transistors, and can be, for example, an active matrix substrate including various conductive lines such as thin-film transistors on a transparent substrate. Examples of the transparent substrate include glass substrates and plastic substrates. In the case that the transparent substrate is a flexible plastic substrate, a flexible organic EL display panel can be obtained. Also, similarly to the circuit diagram as illustrated in FIG. 13, the cathode 4 is electrically connected to the drain electrode of each thin-film transistor, and the anode 5 is at a common potential.

The suitable material of the semiconductor layer of each thin-film transistor is an oxide semiconductor. Oxide semiconductors have advantages of higher mobility and smaller property variation than amorphous silicon. For this reason, thin-film transistors containing an oxide semiconductor can be driven at a higher speed, have a higher driving frequency, and occupy a smaller proportion of one pixel, than those containing amorphous silicon. Hence, such thin-film transistors are suitable for driving of next-generation display devices with higher definition. Also, since oxide semiconductor films are formed by a more simple process than that for polycrystalline silicon films, oxide semiconductor films can be advantageously applied to devices that require a large area. Accordingly, in the case that the organic EL element of Embodiment 1 is driven by thin-film transistors containing an oxide semiconductor, even faster driving can be achieved.

Examples of the oxide semiconductors include a compound (In—Ga—Zn—O) consisting of indium (In), gallium (Ga), zinc (Zn), and oxygen (O), a compound (In—Tin—Zn—O) consisting of indium (In), tin (Tin), zinc (Zn), and oxygen (O), and a compound (In—Al—Zn—O) consisting of indium (In), aluminum (Al), zinc (Zn), and oxygen (O).

In the case that the cathode 4 has light reflectance and the anode 5 has light transmittance in the organic EL display panel 1a of Embodiment 1, the organic EL display panel 1a is a top emission organic EL display panel which emits light from the anode 5 side. In the case that the cathode 4 has light transmittance and the anode 5 has light reflectance, the organic EL display panel 1a is a bottom emission organic EL display panel which emits light from the cathode 4 side.

An electrode having light reflectance can be made of a metal such as Al and In, for example. An electrode having light transmittance can be made of ITO or indium zinc oxide (IZO), for example.

The hole injection layer 6a, the hole transport layer 7a, the light-emitting layer 8a, the electron transport layer 9a, and the electron injection layer 10a can be the same as those used in an ordinary organic EL element. In particular, since the electron injection layer 10a can be made of an easily handleable conventionally used material other than elemental Li, such as LiF, Al—Li, and LiF/Al, an easily producible organic EL display panel can be provided. Examples of other materials of the electron injection layer 10a include those containing an alkali metal or an alkaline earth metal, such as cesium fluoride (CsF), calcium fluoride ($CaF_2$), and magnesium fluoride ($MgF_2$). The hole injection layer 6a can be, for example, a co-deposited film (OMox) of molybdenum oxide ($MoO_x$) and 4,4'-bis[N-(1-naphthyl)-N-phenylamino]-biphenyl (α-NPD) disclosed in the examples in Patent Literature 4.

The organic EL element 3a may also optionally include a hole-blocking layer and an electron-blocking layer, or may include a layer having two or more functions, such as a hole injection/hole transport layer obtained by integrating the hole injection layer 6a and the hole transport layer 7a, and an electron injection/electron transport layer obtained by integrating the electron transport layer 9a and the electron injection layer 10a.

The charge conversion layer 11a may be any layer that can inject electrons into the cathode 4 and inject holes into the hole injection layer 6a. The charge conversion layer 11a can be, for example, a charge-generating layer or layer obtained by laminating a layer having electron injection ability and a charge-generating layer in the given order. The charge-generating layer can be made of a material that generates hole-electron pairs in the layer. Examples thereof include p-type oxides such as molybdenum trioxide ($MoO_3$), vanadium pentoxide ($V_2O_5$), copper(I) oxide ($Cu_2O$), and composite oxides containing Cu. Since the layer having electron injection ability can be made of an easily handleable conventionally used material other than elemental Li, such as LiF, Al—Li, and LiF/Al, an easily producible organic EL display panel can be provided. Examples of other materials of the layer having electron injection ability include those containing an alkali metal or an alkaline earth metal, such as CsF, $CaF_2$, and $MgF_2$. As described above, holes can be injected from the cathode 4 into the hole injection layer 6a through the charge conversion layer 11a. In other words, the charge conversion layer 11a injects holes, which have opposite polarity to the cathode 4, into the hole injection layer 6a.

The charge conversion layer 11b may be any layer that injects holes into the anode 5 and injects electrons into the electron injection layer 10a. The charge conversion layer 11b can be, for example, a charge-generating layer or a layer obtained by laminating a charge-generating layer and a layer having hole injection ability in the given order. The layer having hole injection ability can be made of the same material as the hole injection layer 6a, such as OMox. As described above, electrons can be injected from the anode 5 into the electron injection layer 10a through the charge conversion layer 11b. In other words, the charge conversion layer 11b injects electrons, which have the opposite polarity to the anode 5, into the electron injection layer 10a.

Also, in the case that the anode 5 is made of a material such as ITO, it is concerned that secondary electrons and plasma emitted in the formation (sputtering) of the anode 5, for example, damage the electron injection layer 10a, and thereby degrade the electron injection performance. However, since the organic EL display panel 1a of Embodiment 1 includes the charge conversion layer 11b between the electron injection layer 10a and the anode 5 to separate the electron injection layer 10a and the anode 5, the damage as described above can be sufficiently prevented. Also, intentionally providing a large thickness to the charge conversion layer 11b further prevents the above-described damage and thus further increases the reliability. The thickness of the charge conversion layer 11b is preferably 10 nm or greater, more preferably 50 nm or greater.

Figure 9:
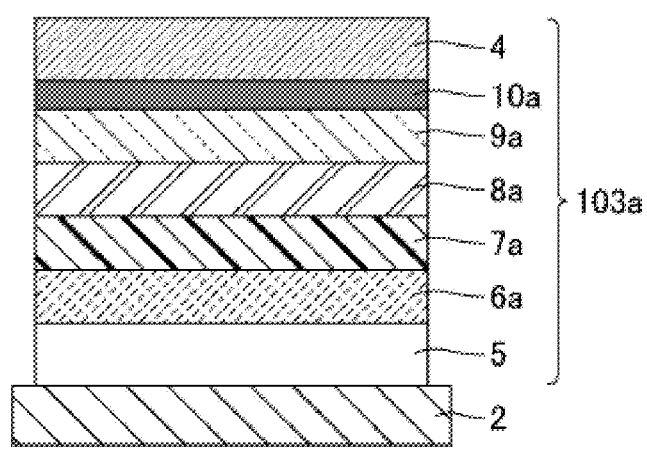
FIG. 9 is a schematic cross-sectional view illustrating a conventional ordinary organic EL display panel.
Figure 10:
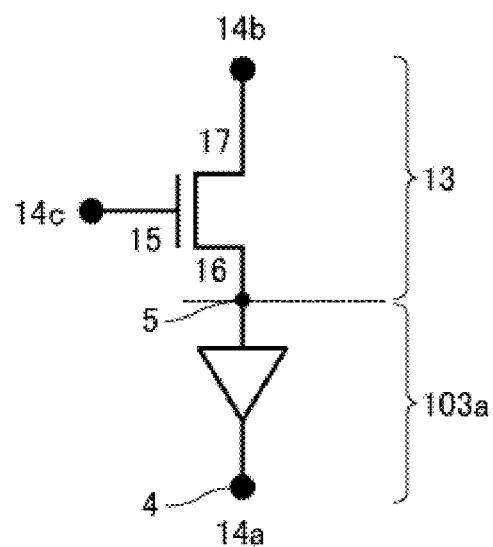
FIG. 10 is an equivalent circuit diagram of the vicinity of an interface between the anode and the active matrix substrate in FIG. 9.
Figure 11:
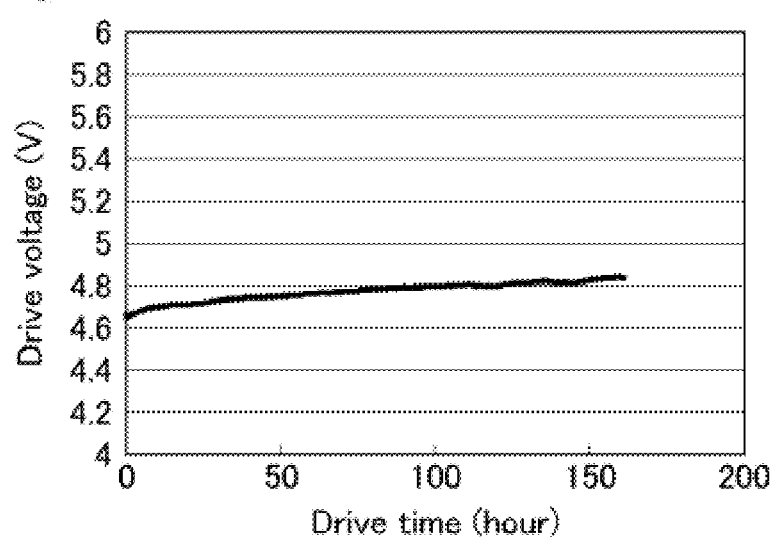
FIG. 11 is a graph showing the drive voltage of an organic EL element.
Figure 12:
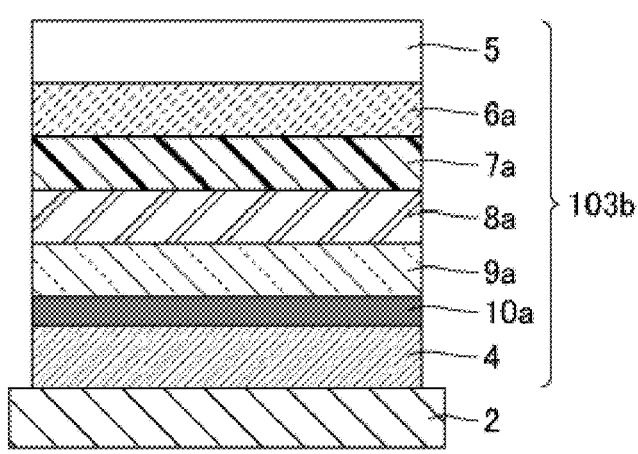
FIG. 12 is a schematic cross-sectional view illustrating a conventional inverted organic EL display panel.

As described above, in the organic EL display panel 1a, a configuration can be obtained in which the cathode 4 and the anode 5 are disposed at the opposite positions with respect to the conventional ordinary organic EL display panel 101a as illustrated in FIG. 9 by use of the charge conversion layers 11a and 11b, without changing the lamination order of the hole injection layer 6a, the hole transport layer 7a, the light-emitting layer 8a, the electron transport layer 9a, and the electron injection layer 10a. Also, since the electron injection layer 10a is disposed on the electron transport layer 9a in the organic EL display panel 1a, the organic EL display panel 1a shows electron injection performance at the same level as that of the conventional ordinary organic EL display panel 101a and can sufficiently prevent degradation of electron injection performance compared to the conventional inverted organic EL display panel 101b as illustrated in FIG. 12.

Hereinafter, examples in each of which the organic EL display panel of Embodiment 1 was actually produced are described.

EXAMPLE 1-1

Example 1-1 relates to a top emission organic EL display panel which emits light from the anode side. Here, the charge conversion layer 11a was a layer obtained by laminating a layer having electron injection ability and a charge-generating layer in the order from the active matrix substrate 2 side. The charge conversion layer 11b was a layer obtained by laminating a charge-generating layer and a layer having hole injection ability in the order from the active matrix substrate 2 side.

Figure 2:
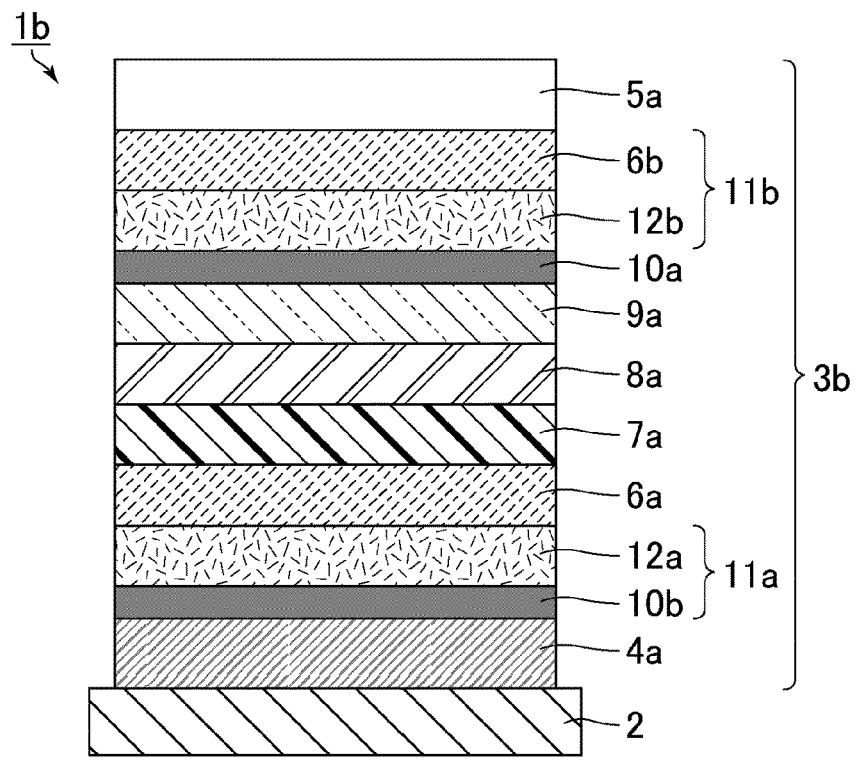
FIG. 2 is a schematic cross-sectional view illustrating an organic EL display panel of Example 1-1.

FIG. 2 is a schematic cross-sectional view illustrating an organic EL display panel of Example 1-1. As illustrated in FIG. 2, an organic EL display panel 1b includes the active matrix substrate 2 and an organic EL element 3b disposed on the active matrix substrate 2. The organic EL element 3b includes, in the order from the active matrix substrate 2 side, the cathode 4a, the charge conversion layer 11a, the hole injection layer 6a, the hole transport layer 7a, the light-emitting layer 8a, the electron transport layer 9a, the electron injection layer 10a, the charge conversion layer 11b, and the anode 5a.

The charge conversion layer 11a includes a layer 10b having electron injection ability and a charge-generating layer 12a (first charge-generating layer) in the order from the active matrix substrate 2 side. The charge conversion layer 11b includes a charge-generating layer 12b (second charge-generating layer) and a layer 6b having hole injection ability in the order from the active matrix substrate 2 side.

The cathode 4a was made of Al, and the anode 5a was made of ITO. The hole injection layer 6a and the layer 6b having hole injection ability were made of OMox. The hole transport layer 7a was made of α-NPD. The light-emitting layer 8a was made of a blue light-emitting material obtained by mixing a dopant material BD-310 and a host material BH-232 available from Idemitsu Kosan Co., Ltd. The electron transport layer 9a was made of Bphen. The electron injection layer 10a and the layer 10b having electron injection ability were made of ultrathin films of Al—Li. Here, easily handleable conventionally used materials other than elemental Li, such as LiF and LiF/Al, can also be used. The charge-generating layers 12a and 12b were made of $MoO_3$, and each are ohmically connected to the layers in contact therewith.

Figure 3:
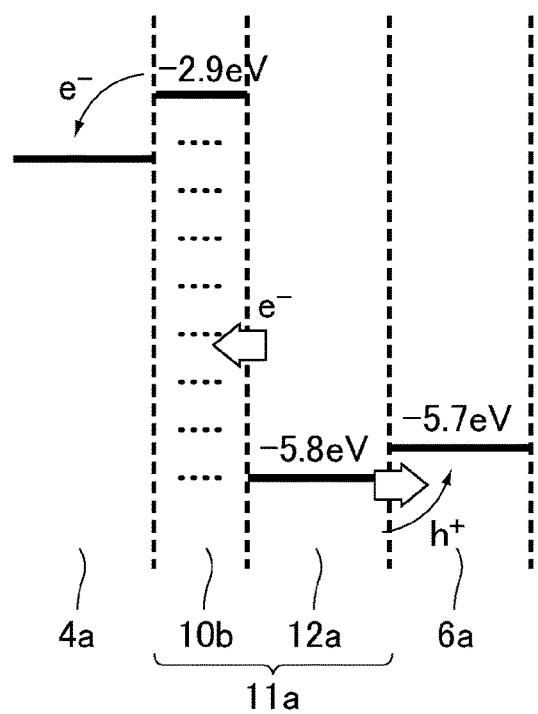
FIG. 3 is a band correlation diagram explaining charge conversion on the cathode side.

Here, the charge conversion by the charge conversion layer 11a is explained with reference to FIG. 3. FIG. 3 is a band correlation diagram explaining charge conversion on the cathode side. As illustrated in FIG. 3, of the hole-electron pairs generated in the charge-generating layer 12a (energy level: −5.8 eV) constituting the charge conversion layer 11a, the holes are injected into the hole injection layer 6a (energy level: −5.7 eV) while the electrons are injected into the layer 10b (energy level: −2.9 eV) having electron injection ability. Then, the electrons are injected from the layer 10b having electron injection ability into the cathode 4a. Thus, the holes can be injected from the cathode 4a into the hole injection layer 6a through the charge conversion layer 11a. The charge conversion process is the same in the other examples.

Figure 4:
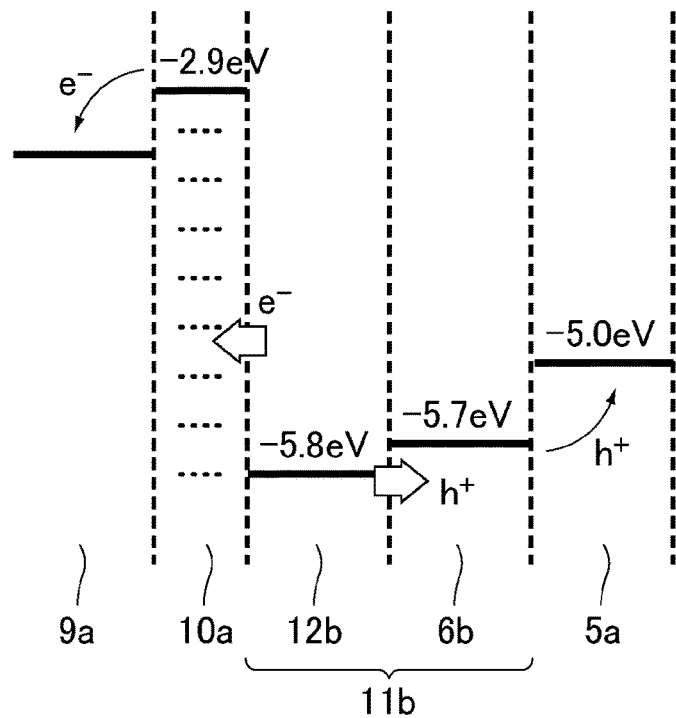
FIG. 4 is a band correlation diagram explaining charge conversion on the anode side.

Next, the charge conversion by the charge conversion layer 11b is explained with reference to FIG. 4. FIG. 4 is a band correlation diagram explaining charge conversion on the anode side. As illustrated in FIG. 4, of the hole-electron pairs generated in the charge-generating layer 12b (energy level: −5.8 eV) constituting the charge conversion layer 11b, the holes are injected into the layer 6b (energy level: −5.7 eV) having hole injection ability while the electrons are injected into the electron injection layer 10a (energy level: −2.9 eV). Then, the holes are injected from the layer 6b having hole injection ability into the anode 5a, while the electrons are injected from the electron injection layer 10a into the electron transport layer 9a. Thus, the electrons can be injected from the anode 5a into the electron injection layer 10a through the charge conversion layer 11b. The charge conversion process is the same in the other examples.

[Analysis Results: Current-Voltage Properties]

Figure 5:
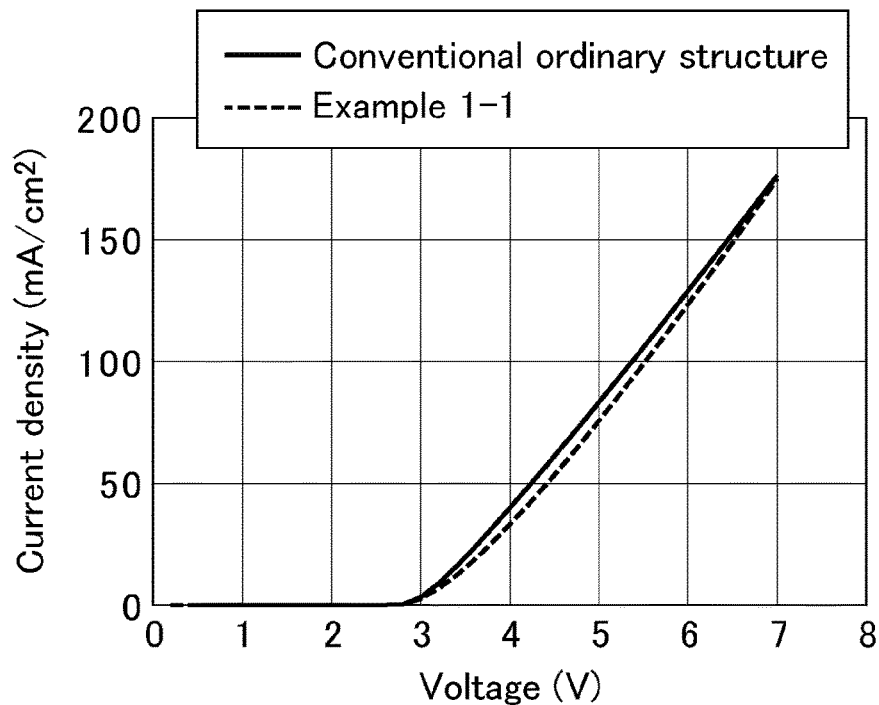
FIG. 5 is a graph showing the current-voltage properties of the organic EL display panel of Example 1-1 and a conventional ordinary organic EL display panel.

FIG. 5 is a graph showing the current-voltage properties of the organic EL display panel of Example 1-1 and a conventional ordinary organic EL display panel. The horizontal axis in FIG. 5 indicates voltage, and the vertical axis indicates current density. The conventional ordinary organic EL display panel has a structure as illustrated in FIG. 9, and the materials of the respective layers thereof were the same as those described in Example 1-1. In the present analysis, a glass substrate was used in place of the active matrix substrate 2. For the measurements of the current density and the voltage, a source meter (model: 2400) available from TFF Corporation Keithley Instruments was used.

As shown in FIG. 5, there was no significant difference in the current-voltage properties between the organic EL display panel of Example 1-1 and the conventional ordinary organic EL display panel. These results show that the organic EL display panel of Example 1-1 exhibits substantially the same electron injection performance as the conventional ordinary organic EL display panel.

As described above, the organic EL display panel of Example 1-1 has an inverted structure, can sufficiently prevent degradation of the electron injection performance, and can provide increased ease of production.

EXAMPLE 1-2

Example 1-2 relates to a bottom emission organic EL display panel which emits light from the cathode side. Since the organic EL display panel of Example 1-2 is the same as that of Example 1-1 except for the materials of the cathode and the anode, the same points are not described here.

Figure 6:
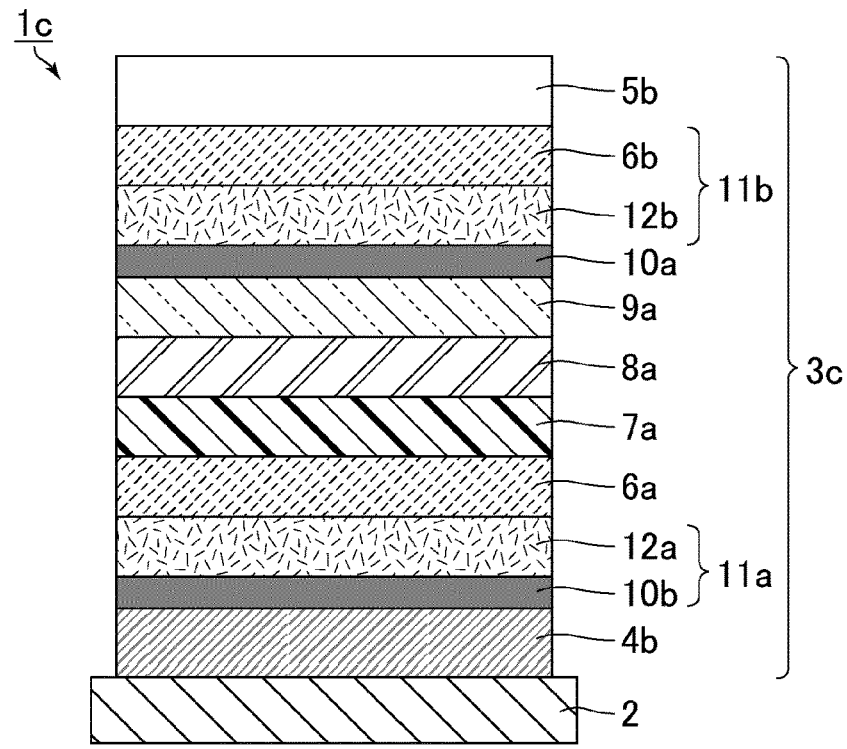
FIG. 6 is a schematic cross-sectional view illustrating an organic EL display panel of Example 1-2.

FIG. 6 is a schematic cross-sectional view illustrating an organic EL display panel of Example 1-2. As illustrated in FIG. 6, an organic EL display panel 1c includes the active matrix substrate 2 and an organic EL element 3c disposed on the active matrix substrate 2. The organic EL element 3c includes, in the order from the active matrix substrate 2 side, the cathode 4b, the charge conversion layer 11a, the hole injection layer 6a, the hole transport layer 7a, the light-emitting layer 8a, the electron transport layer 9a, the electron injection layer 10a, the charge conversion layer 11b, and the anode 5b. The cathode 4b was made of ITO, and the anode 5b was made of Al.

Of course, since the organic EL display panel of Example 1-2 is the same as that of Example 1-1 except for the materials of the cathode and the anode, the organic EL display panel of Example 1-2 exhibits substantially the same electron injection performance as the conventional ordinary organic EL display panel.

Accordingly, the organic EL display panel of Example 1-2 has an inverted structure, can sufficiently prevent degradation of the electron injection performance, and can provide increased ease of production.

The combination of components for the charge conversion layers 11a and 11b may be any of the following combinations (a) to (c) as well as the combinations described in Examples 1-1 and 1-2. Any of the following combinations can also achieve the same charge conversion as described in Examples 1-1 and 1-2, and therefore can provide the same effects as those in Examples 1-1 and 1-2.

(a) A combination in which the charge conversion layer 11a is the charge-generating layer 12a and the charge conversion layer 11b is the charge-generating layer 12b.

(b) A combination in which the charge conversion layer 11a is a layer obtained by laminating the layer 10b having electron injection ability and the charge-generating layer 12a in the given order, and the charge conversion layer 11b is the charge-generating layer 12b.

(c) A combination in which the charge conversion layer 11a is the charge-generating layer 12a, and the charge conversion layer 11b is a layer obtained by laminating the charge-generating layer 12b and the layer 6b having hole injection ability in the given order.

[Embodiment 2]

Embodiment 2 relates to a configuration in which the cathode and the anode are disposed at the opposite positions with respect to a conventional tandem organic EL display panel including two light-emitting layers and a charge-generating layer between the light-emitting layers, and a charge conversion layer is disposed on the surface of each of these electrodes on the side facing the other electrode.

Figure 7:
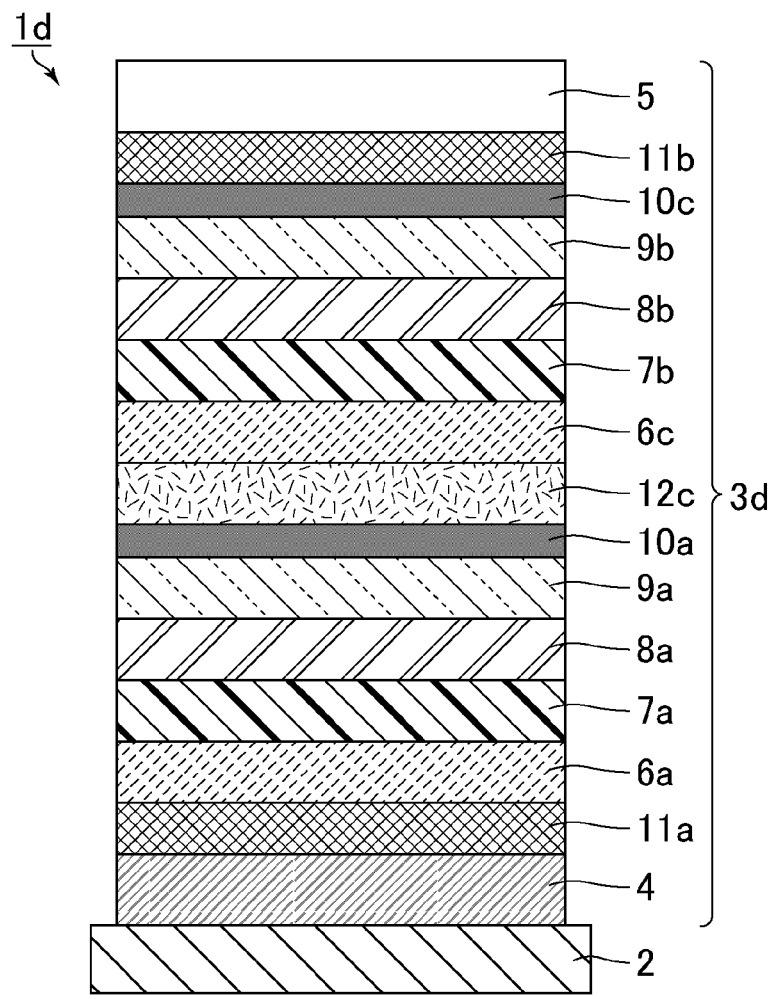
FIG. 7 is a schematic cross-sectional view illustrating an organic EL display panel of Embodiment 2.

FIG. 7 is a schematic cross-sectional view illustrating an organic EL display panel of Embodiment 2. As illustrated in FIG. 7, an organic EL display panel 1d includes the active matrix substrate 2 and an organic EL element 3d disposed on the active matrix substrate 2. The organic EL element 3d includes, in the order from the active matrix substrate 2 side, the cathode 4, the charge conversion layer 11a, the hole injection layer 6a, the hole transport layer 7a, the light-emitting layer 8a, the electron transport layer 9a, the electron injection layer 10a, a charge-generating layer 12c, a hole injection layer 6c (second hole injection layer), a hole transport layer 7b (second hole transport layer), a light-emitting layer 8b (second light-emitting layer), an electron transport layer 9b (second electron transport layer), an electron injection layer 10c (second electron injection layer), the charge conversion layer 11b, and the anode 5.

The hole injection layer 6c, the hole transport layer 7b, the light-emitting layer 8b, the electron transport layer 9b, and the electron injection layer 10c may be the same as those used in ordinary organic EL elements. In particular, since the electron injection layer 10c can be made of an easily handleable conventionally used material as in the case of the electron injection layer 10a, an easily producible organic EL display panel can be provided. The charge-generating layer 12c is disposed to achieve charge conversion between the electron injection layer 10a and the hole injection layer 6c.

The charge conversion layer 11a may be any layer that injects electrons into the cathode 4 and injects holes into the hole injection layer 6a. The charge conversion layer 11a may be, for example, a charge-generating layer or a layer obtained by laminating a layer having electron injection ability and a charge-generating layer in the given order.

Thus, holes can be injected from the cathode 4 into the hole injection layer 6a through the charge conversion layer 11a.

The charge conversion layer 11b may be any layer that injects holes into the anode 5 and injects electrons into the electron injection layer 10c. The charge conversion layer 11b may be, for example, a charge-generating layer or a layer obtained by laminating a charge-generating layer and a layer having hole injection ability in the given order. Thus, electrons can be injected from the anode 5 into the electron injection layer 10c through the charge conversion layer 11b.

As described above, a configuration can be obtained in which the cathode 4 and the anode 5 are disposed at the opposite positions with respect to the conventional tandem organic EL display panel including two light-emitting layers by use of the charge conversion layers 11a and 11b. Also, since the electron injection layer 10a is disposed on the electron transport layer 9a and the electron injection layer 10c is disposed on the electron transport layer 9b in the organic EL display panel 1d, degradation of the electron injection performance can be sufficiently prevented. Tandem organic EL display panels including two light-emitting layers can provide multicolor light emission (white light emission), and therefore the organic EL display panel of Embodiment 2 is suitable for a configuration utilizing a combination of white light emission and color filters. Of course, the same effects can be provided by a configuration in which the cathode and the anode are disposed at the opposite positions with respect to a conventional tandem organic EL display panel including multiple light-emitting layers, and a charge conversion layer is disposed on the surface of each of these electrodes on the side facing the other electrode.

Hereinafter, an example in which the organic EL display panel of Embodiment 2 was actually produced is described.

EXAMPLE 2

Example 2 relates to a tandem, top emission organic EL display panel. Here, the charge conversion layer 11a was a charge-generating layer, and the charge conversion layer 11b was a layer obtained by laminating a charge-generating layer and a layer having hole injection ability in the order from the active matrix substrate 2 side.

Figure 8:
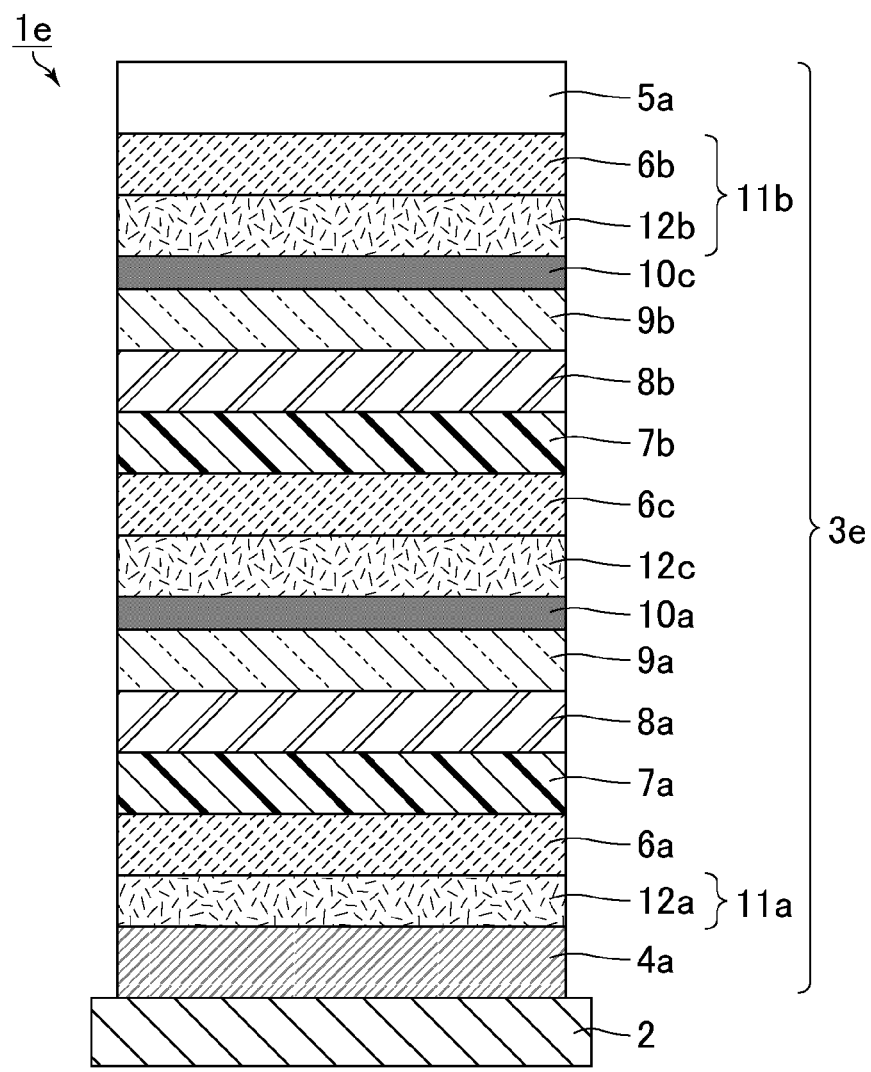
FIG. 8 is a schematic cross-sectional view illustrating an organic EL display panel of Example 2.

FIG. 8 is a schematic cross-sectional view illustrating an organic EL display panel of Example 2. As illustrated in FIG. 8, an organic EL display panel he includes the active matrix substrate 2 and an organic EL element 3e disposed on the active matrix substrate 2. The organic EL element 3e includes, in the order from the active matrix substrate 2 side, the cathode 4a, the charge conversion layer 11a, the hole injection layer 6a, the hole transport layer 7a, the light-emitting layer 8a, the electron transport layer 9a, the electron injection layer 10a, the charge-generating layer 12c, the hole injection layer 6c, the hole transport layer 7b, the light-emitting layer 8b, the electron transport layer 9b, the electron injection layer 10c, the charge conversion layer 11b, and the anode 5a.

The charge conversion layer 11a is the charge-generating layer 12a. The charge conversion layer 11b includes the charge-generating layer 12b and the layer 6b having hole injection ability in the order from the active matrix substrate 2 side.

The cathode 4a was made of Al, and the anode 5a was made of ITO. The hole injection layers 6a and 6c and the layer 6b having hole injection ability were made of OMox. The hole transport layers 7a and 7b were made of α-NPD. The light-emitting layer 8a was made of a blue light-emitting material obtained by mixing a dopant material BD-310 and a host material BH-232 available from Idemitsu Kosan Co., Ltd. The light-emitting layer 8b was formed by laminating a green light-emitting material (a mixture of a dopant material GD-48 available from Universal Display Corporation (UDC) and a host material NS-60 available from Nippon Steel & Sumikin Chemical Co., Ltd.) and a red light-emitting material (a mixture of a dopant material RD-26 available from UDC and a host material NS-60 available from Nippon Steel & Sumikin Chemical Co., Ltd.) in the given order. The electron transport layers 9a and 9b were made of Bphen. The electron injection layers 10a and 10c were made of ultrathin films of Al—Li. Here, easily handleable conventionally used materials other than elemental Li, such as LiF and LiF/Al, can also be used. The charge-generating layers 12a, 12b, and 12c were made of $MoO_3$, and each are ohmically connected to the layers in contact therewith.

The charge conversion by the charge conversion layer 11a is described. Of the hole-electron pairs generated in the charge-generating layer 12a constituting the charge conversion layer 11a, the holes are injected into the hole injection layer 6a while the electrons are injected into the cathode 4a. Thus, the holes can be injected from the cathode 4a into the hole injection layer 6a through the charge conversion layer 11a.

Next, the charge conversion by the charge conversion layer 11b is described. Of the hole-electron pairs generated in the charge-generating layer 12b constituting the charge conversion layer 11b, the holes are injected into the layer 6b having hole injection ability while the electrons are injected into the electron injection layer 10c. Then, the holes are injected from the layer 6b having hole injection ability into the anode 5a, while the electrons are injected from the electron injection layer 10c into the electron transport layer 9b. Thus, the electrons can be injected from the anode 5a into the electron injection layer 10c through the charge conversion layer 11b.

Since the electron injection layer 10a is disposed on the electron transport layer 9a and the electron injection layer 10c is disposed on the electron transport layer 9b in the organic EL display panel 1e, degradation of the electron injection performance can be sufficiently prevented.

As described above, the organic EL display panel of Example 2 has an inverted structure, can sufficiently prevent degradation of the electron injection performance, and can provide increased ease of production.

[Additional Remarks]

Hereinafter, examples of preferred modes of the organic EL display panel of the present invention are described. These examples may be appropriately combined within the spirit of the present invention.

The first charge conversion layer may include a first charge-generating layer, and the second charge conversion layer may include a second charge-generating layer. Such a structure produces the effect of generating hole-electron pairs in the first and second charge-generating layers, whereby the first and second charge conversion layers can be effectively used.

The first charge conversion layer may include a layer having electron injection ability and the first charge-generating layer in the order from the active matrix substrate side. Such a structure produces the effect of generating hole-electron pairs in the first charge-generating layer and the effect of injecting electrons from the layer having electron injection ability, whereby the first charge conversion layer can be effectively used.

The second charge conversion layer may include the second charge-generating layer and a layer having hole injection ability in the order from the active matrix substrate side. Such a structure produces the effect of generating hole-electron pairs in the second charge-generating layer and the effect of injecting holes from the layer having hole injection ability, whereby the second charge conversion layer can be effectively used.

The first charge conversion layer may include a layer having electron injection ability and the first charge-generating layer in the order from the active matrix substrate side, and the second charge conversion layer may include the second charge-generating layer and a layer having hole injection ability in the order from the active matrix substrate side. Such a structure produces the effect of generating hole-electron pairs in the first and second charge-generating layers, the effect of injecting electrons from the layer having electron injection ability, and the effect of injecting holes from the layer having hole injection ability, whereby the first and second charge conversion layers can be effectively used.

The layer having electron injection ability may contain an alkali metal or an alkaline earth metal. Thereby, electrons can be suitably injected from the layer having electron injection ability. The layer having electron injection ability can be made of an easily handleable conventionally used material.

At least one of the first and second charge-generating layers may be made of a p-type oxide. In this case, hole-electron pairs can be generated suitably.

The organic electroluminescent element may further include a laminate between the first electron injection layer and the second charge conversion layer, and the laminate may include one or more charge-generating layers and one or more light-emitting layers alternately in the order from the first electron injection layer side. In this case, the concept of the present invention can be suitably applied to a tandem organic EL display panel including multiple light-emitting layers.

The laminate may include the charge-generating layer, a second hole injection layer, a second hole transport layer, a second light-emitting layer, a second electron transport layer, and a second electron injection layer in the order from the first electron injection layer side. In this case, the concept of the present invention can be suitably applied to a tandem organic EL display panel including two light-emitting layers.

The organic electroluminescent display panel may be a top emission organic electroluminescent display panel which emits light from the anode side. In this case, the concept of the present invention can be suitably applied to a top emission organic EL display panel.

The organic electroluminescent display panel may be a bottom emission organic electroluminescent display panel which emits light from the cathode side. In this case, the concept of the present invention can be suitably applied to a bottom emission organic EL display panel.

The thin-film transistor may include a semiconductor layer containing an oxide semiconductor. Since an oxide semiconductor forms an n-type channel, the concept of the present invention can be suitably applied to oxide semiconductors by connecting an organic electroluminescent element and a thin-film transistor as illustrated in FIG. 13.

REFERENCE SIGNS LIST 1a, 1b, 1c, 1d, 1e, 101a, 101b, 101c, 101d: organic EL display panel 2: active matrix substrate
3a, 3b, 3c, 3d, 3e, 103a, 103b, 103c, 103d: organic EL element
4, 4a, 4b: cathode
5, 5a, 5b: anode
6a, 6c: hole injection layer
6b: layer having hole injection ability
7a, 7b: hole transport layer
8a, 8b: light-emitting layer
9a, 9b: electron transport layer
10a, 10c: electron injection layer
10b: layer having electron injection ability
11a, 11b: charge conversion layer
12a, 12b, 12c: charge-generating layer
13: thin-film transistor
14a, 14b, 14c: power supply voltage
15: gate electrode
16: source electrode
17: drain electrode
18: glass substrate
19: hole-blocking layer

The invention claimed is:

1. An organic electroluminescent display panel comprising:
   an active matrix substrate including a thin-film transistor; and
   an organic electroluminescent element disposed on the active matrix substrate,
   the organic electroluminescent element including, in an order from an active matrix substrate side:
      a cathode electrically connected to the thin-film transistor,
      a first charge conversion layer in contact with the cathode,
      a first hole injection layer,
      a first hole transport layer,
      a first light-emitting layer,
      a first electron transport layer,
      a first electron injection layer,
      a laminate,
      a second charge conversion layer, and
      an anode in contact with the second charge conversion layer,
      the first charge conversion layer defined to inject electrons into the cathode and emit holes to a first light-emitting layer side,
      the second charge conversion layer defined to inject holes into the anode and emit electrons to the first light-emitting layer side,
      the laminate including one or more charge-generating layers and one or more light-emitting layers alternately in order from a first electron injection layer side.

2. The organic electroluminescent display panel according to claim 1, wherein
   the first charge conversion layer includes a first charge-generating layer, and
   the second charge conversion layer includes a second charge-generating layer.

3. The organic electroluminescent display panel according to claim 2, wherein the first charge conversion layer includes a layer having electron injection ability and the first charge-generating layer in the order from the active matrix substrate side.

4. The organic electroluminescent display panel according to claim 2, wherein the second charge conversion layer includes the second charge-generating layer and a layer having hole injection ability in the order from the active matrix substrate side.

5. The organic electroluminescent display panel according to claim 2, wherein
   the first charge conversion layer includes a layer having electron injection ability and the first charge-generating layer in the order from the active matrix substrate side, and
   the second charge conversion layer includes the second charge-generating layer and a layer having hole injection ability in the order from the active matrix substrate side.

6. The organic electroluminescent display panel according to claim 3, wherein the layer having electron injection ability contains an alkali metal or an alkaline earth metal.

7. The organic electroluminescent display panel according to claim 2, wherein at least one of the first and second charge-generating layers is made of a p-type oxide.

8. The organic electroluminescent display panel according to claim 1, wherein the laminate includes the charge-generating layer, a second hole injection layer, a second hole transport layer, a second light-emitting layer, a second electron transport layer, and a second electron injection layer in the order from the first electron injection layer side.

9. The organic electroluminescent display panel according to claim 1, wherein the organic electroluminescent display panel is a top emission organic electroluminescent display panel which emits light from an anode side.

10. The organic electroluminescent display panel according to claim 1, wherein the organic electroluminescent display panel is a bottom emission organic electroluminescent display panel which emits light from a cathode side.

11. The organic electroluminescent display panel according to claim 1, wherein the thin-film transistor includes a semiconductor layer containing an oxide semiconductor.

12. The organic electroluminescent display panel according to claim 5, wherein the layer having electron injection ability contains an alkali metal or an alkaline earth metal.

* * * * *